United States Patent [19]
Mizuno et al.

[11] Patent Number: 5,480,859
[45] Date of Patent: Jan. 2, 1996

[54] BI-SR-CA-CU-O SUPERCONDUCTOR JUNCTION THROUGH A BI-SR-CU-O BARRIER LAYER

[75] Inventors: Koichi Mizuno, Nara; Hidetaka Higashino, Matsubara; Kentaro Setsune, Sakai, all of Japan

[73] Assignee: Matsushita Electric Industrial Co., Ltd., Japan

[21] Appl. No.: 183,795

[22] Filed: Jan. 21, 1994

Related U.S. Application Data

[63] Continuation of Ser. No. 810,971, Dec. 16, 1991, abandoned, which is a continuation of Ser. No. 597,303, Oct. 12, 1990, abandoned.

[30] Foreign Application Priority Data

Oct. 13, 1989 [JP] Japan .................................. 1-266439

[51] Int. Cl.[6] ........................... H01L 39/22; H01L 39/12
[52] U.S. Cl. .............................. 505/190; 257/35; 257/33; 505/238; 505/329; 505/702
[58] Field of Search ........................ 505/1, 190, 238, 505/329, 702; 357/5; 257/25, 35, 31, 32, 33, 34

[56] References Cited

U.S. PATENT DOCUMENTS

| | | | |
|---|---|---|---|
| 4,316,785 | 2/1982 | Suzuki et al. | 257/35 |
| 4,439,269 | 3/1984 | Cukauskas | 257/35 |
| 4,880,771 | 11/1989 | Cava et al. | 505/1 |
| 4,950,643 | 8/1990 | Agostinelli et al. | 505/1 |
| 4,956,335 | 9/1990 | Agostinelli et al. | 505/1 |
| 4,962,086 | 10/1990 | Gallagher et al. | 505/1 |
| 4,968,664 | 11/1990 | Sugihara et al. | 505/1 |
| 5,047,390 | 9/1991 | Higashino et al. | 357/5 |
| 5,061,971 | 10/1991 | Takemura | 257/35 |
| 5,087,605 | 2/1992 | Hedge et al. | 257/35 |
| 5,106,819 | 4/1992 | Takemura | 257/35 |

FOREIGN PATENT DOCUMENTS

| | | | |
|---|---|---|---|
| 0342038 | 5/1989 | European Pat. Off. | |
| 64-54770 | 3/1989 | Japan | 257/31 |

OTHER PUBLICATIONS

P. Strobell, et al., "Phase Diagram Studies in the Bi(Pb)—Sr—Ca—Cu—O System", Journal of the Less–Common Metals, 164 & 165 (1990) 519–525.

W. L. Olson, et al., "Preparation of Superconductivity Tl—Ca—Ba—Cu Thin Films by Chemical Deposition", Appl. Phys. Lett 55(2), 10 Jul. 1989, pp. 188–190.

Sleight et al "High–$T_c$ Bismuth and Thallium Copper Oxide Superconductors" MRS Bulletin Jan. 1989 pp. 45–48.

Face et al "Preparation of Superconducting Thin Films of BiSrCaCu Oxides by Reactive Sputtering" Appl. Phys Lett 53(3) Jul. 18, 1988 pp. 246–248.

Yoshihara et al "Superconductivity of Screen–Printed $YBa_2Cu_3O_y$ Thick Films on $Y_2BaCuO_5$ Substrates" Jap. J. Appl Phys vol. 27 No. 8 Aug. 1988 pp. L1492–1494.

K. Nakamura et al., "Jap. J. Appl. Phys.", 28(3) L437–40 (1989) Synthesis of Artificially Layered Bi—Sr—Ca—Cu—O Films and their Thermal Stability (Mar. 1989.

Y. Matsui et al., "Jap. J. Appl. Phys.", 27(10) L1873–76 (1988) High Resolution Electron Microscopy of Modulated Structure in 20° K. Superconductivity Oxide $Bi_2Sr_2CuO_y$ (Oct. 1988).

(List continued on next page.)

Primary Examiner—Sara W. Crane
Assistant Examiner—Alice W. Tang
Attorney, Agent, or Firm—Wenderoth, Lind & Ponack

[57] ABSTRACT

A superconductor device is provided including a base, a base electrode formed on the base which is made of a Bi-system oxide superconductive material containing an alkaline earth metal, a barrier layer formed on the base electrode which is made of Bi—Sr—Cu—O, a counter electrode formed on the barrier layer which is made of a Bi-system oxide superconductive material containing an alkaline earth metal, a contact electrode formed so as contact with the counter electrode, and a separation layer for separating said contact electrode from said base electrode.

5 Claims, 3 Drawing Sheets

OTHER PUBLICATIONS

D. Shindo et al., "Jap. J. Appl. Phys.", 27(6) L1018–21 (1988) Structure Analysis of High–$T_c$ Superconductor Bi—Ca—Sr—Cu—O by Processing of High–Resolution Electron Microscope Images.

Y. Matsui et al., "Jap. J. Appl. Phys.", 27(7) L1241–44 (1988) High Resolution Electron Microscopy of Intergrowth and Modulated Structure in 110° K. High–$T_c$ Superconducting $Bi_2(Sr_2Ca)_4Cu_3O_y$.

M. Onoda et al., "Jap. J. Appl. Phys.", 27(9) L1665–68 (1988) Simulation of Diffraction Intensity Distribution of a Superconductor Containing Stacking Faults in the BiSrCaCuO system.

K. Mizuno et al., "Advances in Superconductivity II", Proc. of the 2nd Int. Symp. on Superconductivity ISS'89, p. 1017, Nov. 14–17, 1989, Tsukuba.

K. Mizuno et al., "Appl. Phys. Lett.", 56(15) 1469–71 (1990) Fabrication of Thin–Film Type Josephson junctions using a BiSrCaCuO/BiSrCuO/BiSrCaCuO structure.

K. Nakahigashi et al., "Jap. J. Appl. Phys.", 27(5) L747–49 (1988) Phase Transition of $Y_2Ba_2CuO_5$ (May 1988).

A. Shoji et al., "Appl. Phys. Lett.", 46(11) 1098–100 (1985) Niobium Nitride Josephson Junctions with Magnesium Oxide Barriers.

M. Gurvitch et al., "Appl. Phys. Lett.", 42(5) 472–4 (1983) High Quality Refractory Josephson Tunnel Junctions Utilizing Thin Al Layers.

C. T. Rogers, "Appl. Phys. Lett.", 55(19), Nov. 6, 1989, 2032–2034.

"Fabrication of Heteroepitaxial $YBa_2Cu_3O_{7-x}$—$PrBa_2Cu_3O_{7-x}$—$YBa_2Cu_3O_{7-x}$ Josephson Junction Devices Grown by Laser Deposition."

Blamire et al., "Journal of Physics D" 20(10) 1330–1335 (Oct. 1987). Fabrication and Properties of Superconducting Device Structures in $YBa_2Cu_3O_{7-x}$ Thin Films.

Rogers et al., "Appl. Phys. Lett.", 55(19) 2032–2034 (Nov. 1989) Fabrication of Heteroepitaxial $YBa_2Cu_3O_{7-x}$—$PrBa_2Cu_3O_{7-x}$—$YBa_2Cu_3O_{7-x}$ Josephson Devices Grown by Laser Deposition.

4.2 K

20 μV / div.

0.5 mA / div.

4.2 K 12.43 GHz 5dBm

20 μV / div.

0.5 mA / div.

BI-SR-CA-CU-O SUPERCONDUCTOR JUNCTION THROUGH A BI-SR-CU-O BARRIER LAYER

This application is a Continuation of now abandoned application, Ser. No. 07/810,971, filed Dec. 16, 1991 which is a Continuation of now abandoned application Ser. No. 07/597,303 filed Oct. 12, 1990.

BACKGROUND OF THE INVENTION

1. Field of the Invention

The present invention relates to a superconductor device and particularly to a superconductor device having a pair of electrodes made of Bi-system oxide superconductor materials including at least one alkaline earth metal and a barrier layer between the pair of electrodes.

2. Description of the Related Art

Recently, there have been found certain oxide superconductors having a Tc higher than the temperature of liquid nitrogen and, thereby, applicability of the superconductor has been widened greatly.

As an application of the oxide superconductor, there have been proposed Josephson devices of various types such as the point contact type wherein two oxide superconductors are contacted pointwise, bridge type wherein two oxide superconductor thin films are connected with a micro thin film bridge and bonding type wherein two oxide superconductor thin films are connected with a bonding line made of a noble metal such as Au, Ag or the like.

Among those Josephson devices, the point-contact type exhibits only a poor reproducibility and is extremely unstable in operation. The Josephson device of bridge type mentioned above has a disadvantage in that it is easily damaged by a slight electrostatic shock.

In order to avoid these disadvantages of the conventional Josephson devices, an oxide superconductor device having a structure of junction type is highly desired. However, in order to realize this, there are some problems to be solved as follows.

Upon forming a thin film of an oxide superconductor, a very high temperature, higher than about 600° C. is needed and, thereby, the material forming the barrier layer disintegrated by diffusion upon forming a counter electrode of an oxide superconductor. Also, since the thermal expansion coefficients of the material forming the electrode layer and that forming the barrier layer are different from each other, thermal stresses are caused in respective layers when cooled to the ambient temperature and, thereby, the superconductivity of the electrode layer is greatly deteriorated and/or pin holes are generated in the barrier layer.

Further, the crystallinity of the counter electrode is made inferior to that of the base electrode due to mismatch between the lattice constants of materials used for the counter electrode and the barrier layer.

C. T. Rogers et al. proposed heteroepitaxial $YBa_2Cu_3O_{7-x}$—$PrBa_2Cu_3O_{7-x}$—$YBa_2Cu_3O_{7-x}$ Josephson devices of junction type (See Appl. Phys. Lett. 55(19), 6 Nov. 1989). However, the Y-system oxide superconductor used therein has a disadvantage in that it exhibits a large time dependent deterioration by absorbing water vapor.

SUMMARY OF THE INVENTION

An essential object of the present invention is to provide superconductor devices using high Tc oxide superconductor thin films which are free from stresses with reasonable crystallinity even when they are cooled to the ambient temperature after forming thin films at a temperature higher than about 550° C.

Another object of the present invention is to provide Josephson devices of junction type having an excellent stability with a small time dependent deterioration.

In order to accomplish these objects, according to the present invention, there is provided a superconductor device including a base, a base electrode formed on said base which is made of a Bi-system oxide superconductive material containing an alkaline earth metal, a barrier layer formed on said base electrode which is made of Bi—Sr—Cu—O, a counter electrode formed on said barrier layer which is made of a Bi-system oxide superconductive material containing an alkaline earth metal, a contact electrode formed so as to contact with said counter electrode, and a separation layer for separating said contact electrode from said base electrode.

In the superconductor device according to the present invention, both the base electrode and the counter electrode have crystal structures similar to that of the barrier layer since respective layers forming the base electrode, the counter electrode and the barrier layer are made of a Bi-system oxides containing an alkaline earth metal, respectively. Further, it is possible to form respective layers successively in the same vacuum system. Also, it has been found that each layer can be grown epitaxially.

According to one aspect of the present invention, each of the Bi-system oxides forming the base electrode, counter electrode and the barrier layer, respectively, is formed so as to permit the c axis of the crystal to orient, vertically to the surface of the substrate. In this case, each layer has an excellent crystallinity and it becomes possible to realize thin film electrodes having an excellent superconductivity. As a crystalline thin film produced at about 550° C. or more and that the counter electrode exhibits an excellent superconductivity substantially the same to that of the base electrode.

Since the Bi-system oxides for the base electrode, the counter electrode and the barrier layer have similar crystalline structures, as mentioned above, their thermal expansion coefficients on the respective junction planes are substantially the same as each other and, accordingly, no stresses are caused in the respective layers when the device is cooled to an ambient temperature.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Figure 1:
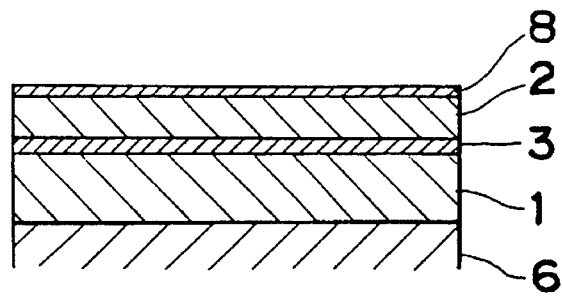
FIGS. 1(a), 1(b), 1(c), 1(d) and 1(e) are sectional views for showing fabrication processes of the superconductor device.
Figure 1:
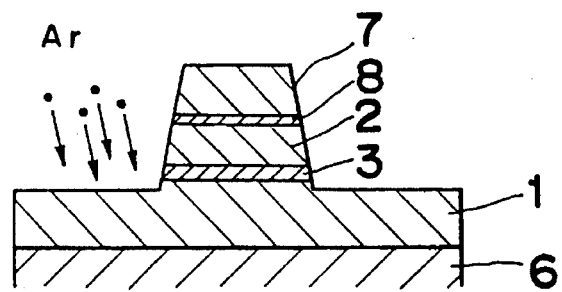
Figure 1:
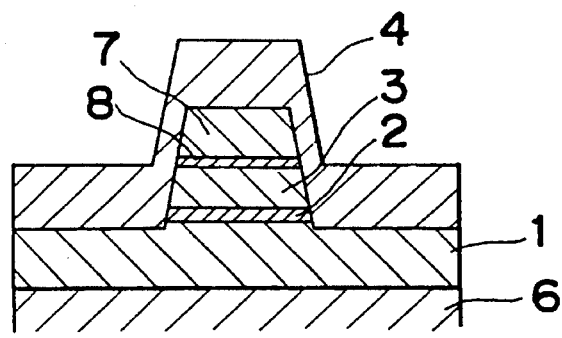
Figure 1:
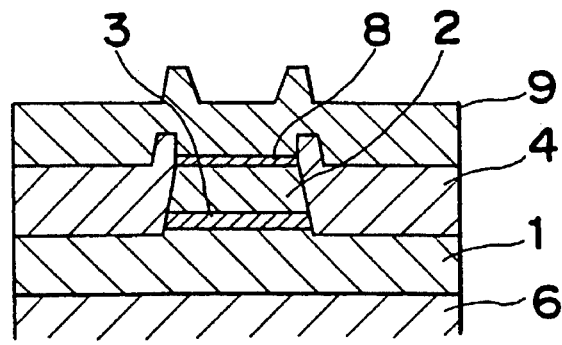
Figure 1:
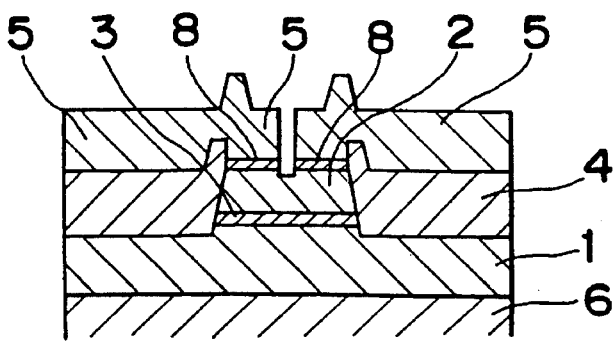

According to the present invention, a superconductor device has a pair of electrodes made of Bi-system oxide superconductive materials containing an alkaline earth metal and a barrier layer formed inbetween the pair of electrodes. According to the present invention, superconductor devices having excellent properties are realized by employing suitable thin film forming processes and using materials having layered structures.

The Bi-system oxide containing an alkaline earth metal to be used for the superconductive base and counter electrodes is Bi—Sr—Ca—Cu—O or Bi—Sr—Ca—Cu—O, and containing at least Pb.

In the case that Pb is added thereto, it contributes to widen the crystallization temperature.

Especially, it is desirable to use the following Bi-system oxide superconductor having a 2212 phase.

$(Bi_{1-y}Pb_y)_2$—$Sr_2$—$Ca_1$—$Cu_2$—$O_x$ ($0 \leq y < 0.5$, x arbitrarily selected).

In this case, stable crystalline structures are obtained easily.

Also, the following Bi-system oxide superconductor having 2223 phase is desirable for widening the range of operational temperature of the superconductor device since superconductors having a high Tc can be obtained thereby.

$(Bi_{1-y}Pb_y)_2$—$Sr_2$—$Ca_2$—$Cu_3$—$O_x$ ($0 \leq y < 0.5$, x is arbitrarily selected.

The material for the barrier layer is Bi—Sr—Cu—O. These materials are desirable since a continuous film formation is possible at a high temperature and the barrier layer formed is a compound having a layered structure.

Namely, materials above mentioned take layered perovskite structures similar to each other and, accordingly, lattice constants in crystal orientations a and b of one layer substantially coincide with those of another layer and, also, the thermal expansion coefficients of them substantially coincide with each other.

Therefore, if the substrate is chosen properly so as to have lattice constants and the thermal expansion coefficient close to those of the layer to be formed thereon, the crystallinity obtained upon film formation is kept unchanged without stresses and the superconductivity of the counter electrode can be obtained almost equal to that of the base electrode even if the superconductor device just formed is cooled to an ambient temperature after film formation at a temperature of 550° C. or more.

(100) MgO substrate or (100) SrTiO₃ substrate is desirably used for the substrate in order to satisfy conditions demanded therefor, as mentioned above.

The following two combinations of the electrodes and the barrier layer are desirably formed together with the substrate mentioned above.

Combination I

The Bi-system oxide superconductor for the electrodes mainly containing the following oxide superconductor of 2212 phase;

$(Bi_{1-y}Pb_y)_2$—$Sr_2$—$Ca_1$—$Cu_2$—$O_x$ ($0 \leq y < 0.5$, x is arbitrarily selected) and the oxide material for the barrier layer mainly containing the following oxide the, $Bi_2$—$Sr_2$—$Cu_1$—$O_x$ (x is arbitrarily selected).

Combination II

The Bi-system oxide superconductor for the electrode mainly containing the following oxide superconductor of the 2223 phase;

$(Bi_{1-y}Pb_y)_2$—$Sr_2$—$Ca_2$—$Cu_3$—$O_x$ ($0 \leq y < 0.5$, x is arbitrarily selected) and the oxide material for the barrier layer mainly containing the following oxide, $Bi_2$—$Sr_2$—$Cu_1$—$O_x$ (x is arbitrarily selected).

In these combinations, the respective layers can be grown epitaxially on the substrate while maintaining it at a temperature from 600° C. to 850° C. and the superconductivities of the base and counter electrodes are found to be improved while keeping their crystallinities even after an annealing treatment at a temperature lower than 700° C. in an oxygen atmosphere.

The inventors of the present invention fabricated superconductor devices of junction type having three layers mentioned above and found that they exhibited a Josephson effect at a Tc of the superconductor electrode or a temperature lower than Tc. In the preferred embodiment FIGS. 1(a), 1(b), 1(c), 1(d) and 1(e) show a fabrication process of the superconductor device according to the present invention.

As shown in FIG. 1(a), at first, a base electrode layer 1 of a thickness of 300 nm is deposited on an MgO substrate 6 by the rf magnetron sputtering method using a target of powder of an oxide. The target was prepared so as to be able to deposit a Bi-system oxide superconductor containing the following oxide superconductor mainly composed of the 22 phase;

$(Bi_{1-y}Pb_y)_2$—$Sr_2$—$Ca_1$—$Cu_2$—$O_x$ ($0 \leq y < 0.5$, x is arbitrarily selected).

Successively, a barrier layer 3 of a thickness of 60 nm was deposited in the same vacuum using a target of powder of an oxide which was prepared so as to be able to deposit a Bi-system oxide containing the following oxide mainly;

$Bi_2$—$Sr_2$—$Cu_1$—$O_x$ (x is arbitrarily selected).

Next, there was deposited a counter electrode 2 of a Bi-system oxide superconductor containing the following oxide superconductor of 2212 phase mainly;

$(Bi_{1-y}Pb_y)_2$—$Sr_2$—$Ca_1$—$Cu_2$—$O_x$ ($0 \leq y < 0.5$, x is arbitrarily selected).

The thickness of the counter electrode 2 was 200 nm. Further, an electrode protection layer 8 of Pt was deposited thereon. The temperature of the substrate 6 was kept at 650° C. during the deposition of the Bi-system oxide.

As shown in FIG. 1(b), the electrode protection layer 8, the counter electrode 2 and the barrier layer 3 were patterned into a pattern of junction of a size 20×40 μm² by the photolithography using a negative photoresist 7 and the ion milling.

Thereafter, as shown in FIG. 1(c), a CaF₂ of 250 nm thickness was deposited as an electrode separation layer 4 by the vacuum evaporation method so as to cover the surface of the device in the state shown in FIG. 1(b) without removing the photoresist layer 7.

Then, the surface of the counter electrode 2, namely the electrode protection layer 8 was exposed by the lift-off method using the O₂ gas plasma processing (1 Torr, 13.56 MHz and 400 W) after ultrasonic clearing with trichloroethane and, then, a Pt film 9 for forming contact electrodes was deposited by the sputtering method, as shown in FIG. 1(d).

Finally, as shown in FIG. 1(e), the Pt film 9 was worked into contact electrodes by the photolithography using a negative photoresist and the ion milling to complete a superconductor device.

It was confirmed by the inventors of the present invention that the superconductor device thus obtained exhibited an excellent Josephson effect, as follows.

Figure 2:
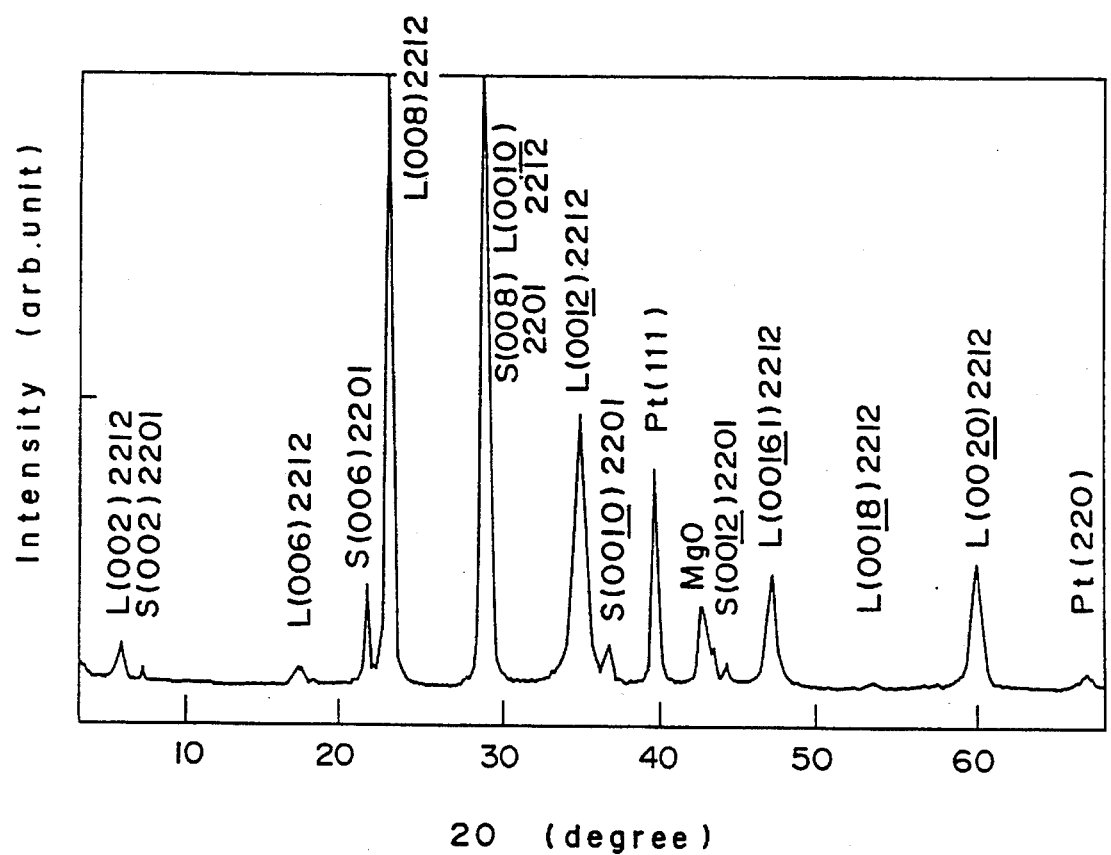
FIG. 2 is a graph showing an x-ray diffraction pattern of the layered structure including three layers.

FIG. 2 is an X-ray diffraction pattern of the three layers forming the superconductor device according to the present invention.

From the data shown in FIG. 2, it is confirmed that each of these layers exhibits a c-axis orientation at a film forming temperature of 650° C. Also, from observation using the fast electron beam diffraction, each layer is grown epitaxially.

Figure 3A:
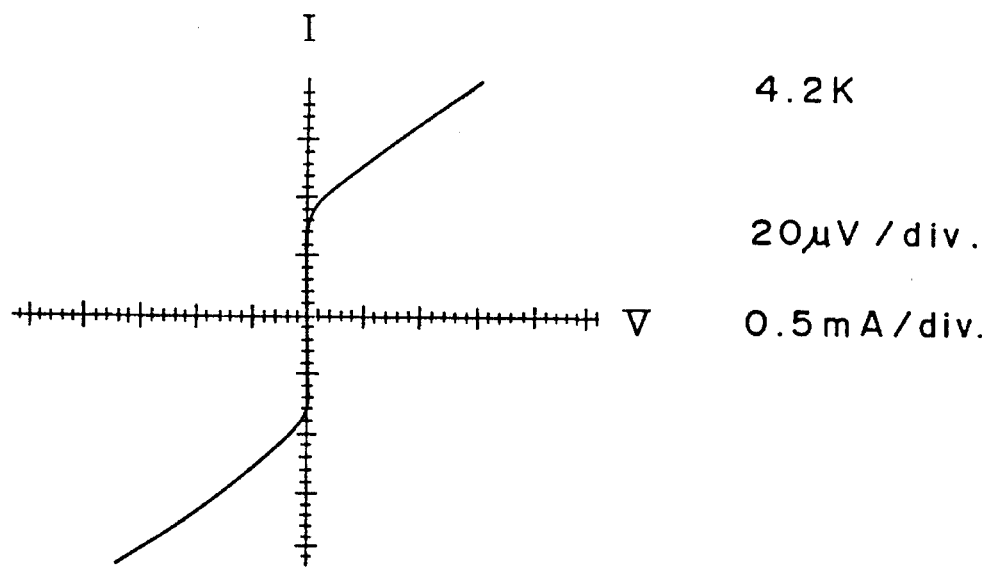
FIG. 3(a) and FIG. 3(b) are graphs showing the current-voltage characteristics of the superconductor device according to the present invention.

The superconductor device according to the present invention exhibits a current-voltage characteristic as shown in FIG. 3(a) and, as is clear from this, it exhibits the so called direct current Josephson effect wherein a superconduction current of 700 μA flows.

Figure 3B:
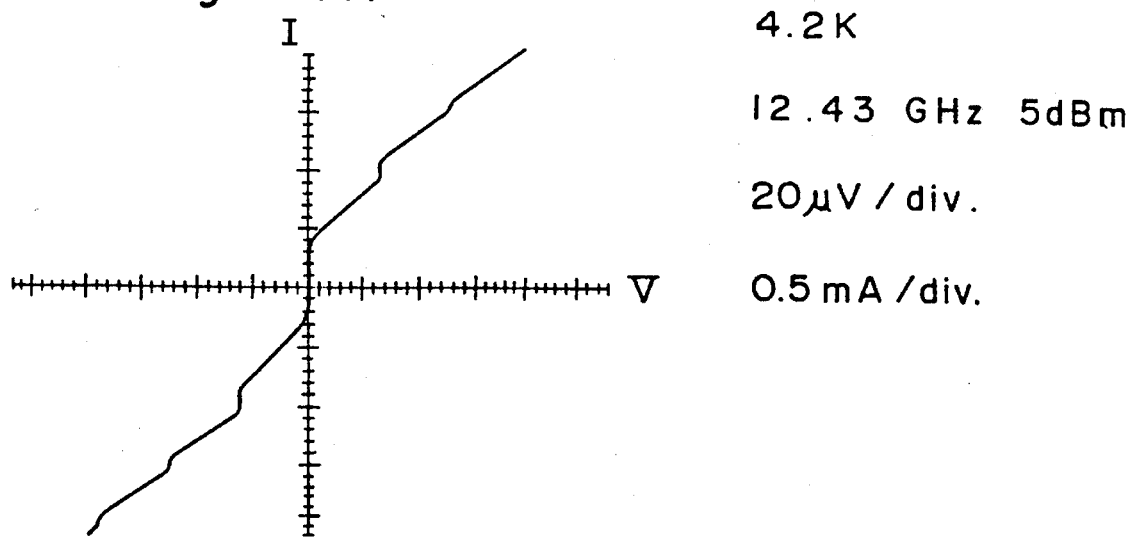

FIG. 3(b) shows a current-voltage characteristic of the device when a high frequency wave of 12 GHz is applied.

As is apparent from this, the device exhibits steps of current at equi-distant voltages. Namely, it exhibits Shapiro steps (so called alternative current Josephson effect).

The three layered structure according to the present preferred embodiment can maintain the crystallinity of each layer as it is, even after an annealing treatment at a temperature equal to or lower than 700° C. in an oxygen atmosphere and the superconductivity of each electrode is improved. Therefore, characteristics of the junction type superconductor device can be much enhanced.

Another triple layered structure having an excellent crystallinity can be obtained by using the following materials;

Bi-system oxide superconductor for the electrode layer containing mainly the following oxide superconductor of 2223 phase;

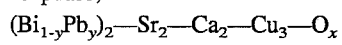
$(Bi_{1-y}Pb_y)_2$—$Sr_2$—$Ca_2$—$Cu_3$—$O_x$ (0≦y<0.5, x is arbitrarily selected) and as a material for the barrier layer mainly containing mainly the following oxide;

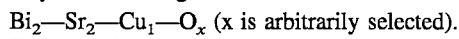
$Bi_2$—$Sr_2$—$Cu_1$—$O_x$ (x is arbitrarily selected).

This combination can also yield an excellent superconductive junction.

Also, it is confirmed by the inventors of the present invention that respective layers oriented in a c-axis direction are grown on a substrate kept at 550° C. or more when used Bi-system oxides oriented in a c-axis direction for the base and counter electrodes and the barrier layer each of which includes at least an alkaline earth metal and that the device of junction type fabricated using the triple layered structure can operate as a superconductor device.

The Bi-system oxide including at least an alkaline earth metal for the base and/or the counter electrodes may be Bi—Sr—Ca—Cu—O, or Bi—Sr—Ca—Cu—O, containing at least Pb.

The Bi-system oxide for the barrier layer may be Bi—Sr—Cu—O.

The base and counter electrodes exhibit excellent superconductivity while retaining their respective crystallinity even after an annealing treatment at a temperature equal to or lower than 700° C. in oxygen atmosphere.

It is to be noted that the material for the electrode protection layer and/or contact electrode may be made of Au, Ag, Pb or Cu but not Pt.

As stated above, all of the base and counter electrodes and the barrier layer constituting the superconductor device according to the present invention are made of Bi-system oxide materials including at least one alkaline earth metal, respectively. Due to this, respective thermal expansion coefficients of these three layers substantially coincide with each other and, thereby, no stresses are caused in respective layers when cooled to a room temperature after forming layers on a substrate kept at 500° C. or more. This enables one to maintain the crystallinity obtained in the film forming process and to obtain the superconductivity of the counter electrode substantially equal to that of the base electrode.

It is especially desirable to grow the respective Bi-system oxides forming the base and counter electrodes and the barrier layer so as to orient each c-axis of the crystals forming them perpendicularly to the surface of the substrate. Since the lattice constants in a and b orientations of each layer coincide with those of the adjacent layer, each layer can have an excellent crystallinity and the base and counter electrodes can have excellent superconductivity.

When the combination I or II mentioned above is employed together with (100) $SrTiO_3$ or (100) MgO substrate, respective layers can be epitaxially grown on the substrate in succession while keeping the substrate at a temperature from 600° C. to 850° C. and, even after an annealing treatment at a temperature equal to or lower than 700° C. in an oxygen atmosphere, the base and counter electrodes can maintain their crystallinities and exhibit excellent superconductivities.

According to the superconductor devices of junction type fabricated using the triple layered structure mentioned above, Josephson devices exhibiting an excellent Josephson effect can be obtained.

As one application of the superconductor, there is proposed a superconducting quantum interference device (SQUID) including at least a Josephson junction as one of components thereof.

The SQUID exhibits a very high sensitivity to an external magnetic field and is available for various magnetic measurements such as biological magnetic measurement, geomagnetic measurement and the like or for computer memories or logic circuits using switching devices with a low power demand.

Especially in the field of biological magnetic measurement, it becomes possible to measure or observe necrological activities in the brain from the outside. Accordingly, the SQUID is highly regarded not only in the field of fundamental medical science but also in the field of clinical medicine.

The present invention offers the possibility that the SQUID system can be realized at a low cost and can be operated with use of liquid nitrogen which is easy to handle.

The superconductor device according to the present invention can operate as a Josephson device and is possible to constitute a SQUID operable at the temperature of liquid nitrogen by improving the superconductivity of the superconductor electrode.

It is understood that various other modifications will be apparent to and can be readily made by those skilled in the art without departing from the scope and spirit of the present invention.

Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A superconductor device including a substrate, a base electrode formed on said substrate which is made of a Bi system oxide superconductive material containing an alkaline earth metal represented by $Bi_2$—$Sr_2$—$Ca_1$—$Cu_2$—$O_x$ (x is optionally selected) or $Bi_2$—$Sr_2$—$Ca_2$—$Cu_3$—$O_x$ (x is optionally selected) as a main phase, a barrier layer formed on said base electrode which is made of a non-superconductive material containing a Bi oxide represented by $Bi_2$—$Sr_2$—$Cu_1$—$O_x$ (x is optionally selected) as a main phase, said barrier layer having a thickness of 10 nm or more, a counter electrode formed on said barrier layer which is made of a Bi system oxide superconductive material containing an alkaline earth metal represented by $Bi_2$—

$Sr_2$—$Ca_1$—$Cu_2$—$O_x$ (x is optionally selected) or $Bi_2$—$Sr_2$—$Ca_2$—$Cu_3$—$O_x$ (x is optionally selected) as a main phase, each of said base electrode, barrier layer and counter electrode being oriented in the same direction perpendicular to the substrate, a contact electrode formed so as to contact said counter electrode, and a separation layer for separating said contact electrode from said base electrode.

2. The superconductor device as claimed in claim 1 in which each of said base electrode, barrier layer and counter electrode is formed in an epitaxial relation.

3. The superconductive device as claimed in claim 1 in which Bi contained in said superconductive material of said base electrode or counter electrode is partially substituted by Pb.

4. The superconductive device as claimed in claim 1 in which said Bi-system oxide superconductive material is mainly comprised of an oxide superconductor having a composition represented by $(Bi_{1-y}Pb_y)_2$—$Sr_2$—$Ca_1$—$Cu_2$—$O_x$ ($0 \leq y < 0.5$, X is optionally selected)
and said barrier layer is mainly comprised of an oxide having a composition represented by $Bi_2$—$Sr_2$—$Cu_1$—$O_x$ (x is optionally selected).

5. The superconductor device as claimed in claim 1 in which said Bi-system oxide superconductive material is mainly comprised of an oxide superconductor having a composition represented by $(Bi_{1-y}Pb_y)_2$—$Sr_2$—$Ca_2$—$Cu_3$—$O_x$ ($0 \leq y < 0.5$, X is optionally selected) and said barrier layer is mainly comprised of an oxide having a composition represented by $Bi_2$—$Sr_2$—$Cu_1$—$O_x$ (x is optionally selected).

* * * * *